United States Patent
Mueller et al.

(10) Patent No.: US 8,773,190 B2
(45) Date of Patent: Jul. 8, 2014

(54) FINE RF TRANSCEIVER DC OFFSET CALIBRATION

(71) Applicants: Peter Mueller, Dresden (DE); Gunnar Nitsche, Radebeul (DE)

(72) Inventors: Peter Mueller, Dresden (DE); Gunnar Nitsche, Radebeul (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/791,686

(22) Filed: Mar. 8, 2013

(65) Prior Publication Data
US 2013/0234773 A1 Sep. 12, 2013

(30) Foreign Application Priority Data
Mar. 8, 2012 (EP) .................................. 12158582
Mar. 8, 2012 (EP) .................................. 12158600

(51) Int. Cl.
*H03L 5/00* (2006.01)

(52) U.S. Cl.
USPC ............................................. 327/307; 327/362

(58) Field of Classification Search
USPC .......................... 327/307, 362; 330/9
See application file for complete search history.

(56) References Cited

U.S. PATENT DOCUMENTS

| | | | |
|---|---|---|---|
| 6,225,848 B1 * | 5/2001 | Tilley et al. | .................. 327/307 |
| 7,239,199 B1 | 7/2007 | Chien | |
| 7,436,236 B2 * | 10/2008 | Hjelm | .......................... 327/307 |
| 2002/0094792 A1 | 7/2002 | Oono | |
| 2006/0222117 A1 | 10/2006 | Rahman | |
| 2006/0284671 A1 | 12/2006 | Ohba | |
| 2007/0153945 A1 | 7/2007 | Gupta | |
| 2007/0184803 A1 | 8/2007 | Aytur | |

* cited by examiner

*Primary Examiner* — Hai L Nguyen
(74) *Attorney, Agent, or Firm* — SpryIP, LLC

(57) ABSTRACT

An implementation relates to compensating DC offset in a signal path. The signal path may have a plurality of stages, where for each stage a fine DC compensation is performed by introducing a fine DC compensation signal into the signal path of the stage by way of a compensation analog to digital converter.

13 Claims, 6 Drawing Sheets

Simplified receiver model with DC offset sources, compensation DACs and variable gain blocks.

FIG 2  Simplified receiver model with DC offset sources, compensation DACs and variable gain blocks.

FIG 3  Mathematical receiver model with variable gain blocks, DC offset and DC compensation sources.

Simple algorithm for raw DC offset calibration.

Algorithm for gain independent DC offset calibration.

FINE RF TRANSCEIVER DC OFFSET CALIBRATION

RELATED APPLICATIONS

This application claims priority benefit of European Patent Application Nos. 12158600.2 and 12158582.2, both filed on Mar. 8, 2012. The entire contents of the prior filed European Patent Applications are hereby incorporated herein by reference.

BACKGROUND

Implementations relate to a method and device for compensating DC offset in RF transceivers. One or more particular implementations relate to a method for performing fine DC offset compensation.

Integrated direct conversion RF transceiver architectures became popular in the last decade for many different RF applications. They require a minimal set of building blocks, see FIG. 1. Each RX or TX signal path requires only one mixer with associated local oscillator which also simplifies the synthesizer. An IF filter is no longer needed.

But this architecture has also drawbacks. DC offset is introduced by the individual transceiver/receiver components like the amplifier, mixer, filter etc. It may distort the signal, and directly limits the available dynamic range. Strong offsets can saturate the signal path and also violate the digital signal processing. It became common to compensate this DC offset by adding DC voltages opposite to the occurring DC offset. Several different solutions have been developed in the past.

One typical approach is providing additional hardware blocks as disclosed in U.S. Pat. No. 6,756,924 B2 or U.S. Pat. No. 7,271,649 B2 or Tanaka, T. Yamawaki, K. Takikawa, N. Hayashi, I. Ohno, T. Wakuta, S. Takahashi, M. Kasahara, and B. Henshaw, "GSM/DCS1800 Dual Band Direct-Conversion Transceiver IC With a DC Offset Calibration System," in 01 ESSCIRC Session 3.3, 2001. These blocks are typically dedicated to individual building blocks. The DC offset is measured and compensated. This approach requires additional elements not only for compensation, e.g. DACs, but also for measuring the DC offset and for determining the value needed for compensation. These blocks are running permanently. They increase the system complexity and consume additional power and space.

Other approaches determine the DC offset and the resulting DC compensation values permanently in the digital domain as disclosed in Marko Mailand and Hans-Joachim Jentschel, "Compensation of DC-Offsets and RF-Self-Mixing Products in Six-Port-Based Analog Direct Receivers," in 14th IST Mobile & Wireless Communication Summit, Dresden, June 2005; or Russell Hoppenstein, "DC Offset Auto-Calibration of TRF371x," Texas Instruments, 2010; or I.-H. Sohn, E-R. Jeong, and Y. H. Lee, "Data-Aided Approach to I/Q Mismatch and DC Offset Compensation in Communication Receivers," IEEE COMMUNICATIONS LETTERS, vol. 6, no. 12, December 2002. The compensation values are introduced by a DAC in the analog section. But this concept prepares only one set of compensation values. This works well if the system gain is fixed. But systems with variable gain make the DC offset variably as well. Therefore, every new gain configuration requires new DC offset values to be measured and new compensation values to be set. This increases the acts to be done to change the gain as additional calibration acts must be executed as well for every new gain setting. Setting the gain as such becomes more complex and time consuming.

FIG. 1 shows a state-of-the art direct conversion receiver comprising a plurality of components like a low noise amplifier 12, mixer 13, filter 14, VGA 15, ADC 16, digital DC offset compensation 17 between radio frequency (RF) input 11 and baseband (BB) output. Direct conversion RF transceivers, e.g. for WLAN, did use more than one point to enter DC compensation voltages by additional DACs 18, 19. These DC compensation voltages (the calibration parameters) were typically determined from different measurements and from calculations in the digital domain, e.g. by a signal processor. It is common to add short cut and bypass switches to the individual transceiver/receiver components to measure the DC offset that occurs at each individual stage separately. Therefore, some of the components were operated under debug/test conditions (bypass or short cut mode) instead of the real operation conditions while the DC offset is measured. This introduces additional errors, e.g. due to different bias or temperature conditions, and increases the system complexity.

It is generally intended to find a set of calibration parameters that covers the complete gain control range. But this is not common in present implementations as the accuracy of the determined calibration parameters is insufficient. Therefore, the complete gain control range is split into several different sub ranges. Each different sub range has an own set of calibration parameters. Changing the gain from one sub range to another requires also the calibration parameters to be changed which is still complex and time consuming.

The transceiver (Rx path) with DC offset sources and compensation DACs (digital to analog converters) given in FIG. 1, can be simplified, see FIG. 2, to a set of variable gain stages 23 corresponding to mixer 13, 24 corresponding to filter 14, 25 corresponding to VGA 15 between RF input 21 and BB output 210, where the DC offset 211, 212, 213 and the compensation DACs 28 and 29 are connected to the input of each individual stage. The mathematical expression of this simplified model is given in FIG. 3 comprising a plurality of gain stages 321, . . . , 32$k$, . . . , 32$n$, DC offsets 330, 331, . . . , 33$k$, . . . 33$n$ and compensation DACs 320, 321, . . . , 32$k$, . . . , 32$n$ between RF input 31 and BB output 35.

The compensation DACs are connected to the signal path, FIG. 1. Each DAC adds a DC voltage that is opposite to the DC offset at this point so that the total DC becomes close to zero. This remaining voltage nonzero DC voltage becomes amplified by the gain stages that follow. As this gain is variable the resulting DC offset at the output of the signal path directly depends on the following total gain and the DC offset residual:

$$\text{mean}(BB_{out}(A_{tot,k})) = A_{tok,k} * (DC_{off,k} + DC_{comp,k})$$

The total gain for the gain stage k (k>0) is given by:

$$A_{tok,k} = \prod_{j=1}^{k} A_{j,i}$$

Therefore, a good calibration method, procedure or algorithm should find values $DC_{comp,k}$ that meet the relation:

$$0 \approx DC_{off,k} + DC_{comp,k}$$

The essential part of the calibration routines is therefore to determine $DC_{off,k}$ accurately from different measured mean ($BB_{out}$) values so that $$DC_{comp,k} = -DC_{off,k}$$

Throughout this document the following notations may be used:

number of total gain stages:
DC offset of gain stage k: $DC_{off,k}$
DC compensation parameter of gain stage k: $DC_{comp,k}$
DC offset residual of gain stage k: $DC_{off,k}+DC_{comp,k}$
gain control range R of gain stage k: $A_{k,R}$
gain i of stage k, were $A_k$, element of $A_{k,R}$: $A_{k,i}$
total gain for gain stage k: $A_{tot,k}$
DC offset residual at ADC output (BB_out): $DC_{res}$

BRIEF DESCRIPTION OF THE DRAWINGS

The method and the device according are described in more detail herein below by way of exemplary embodiments and with reference to the attached drawings, in which.

DETAILED DESCRIPTION

Figure 1:
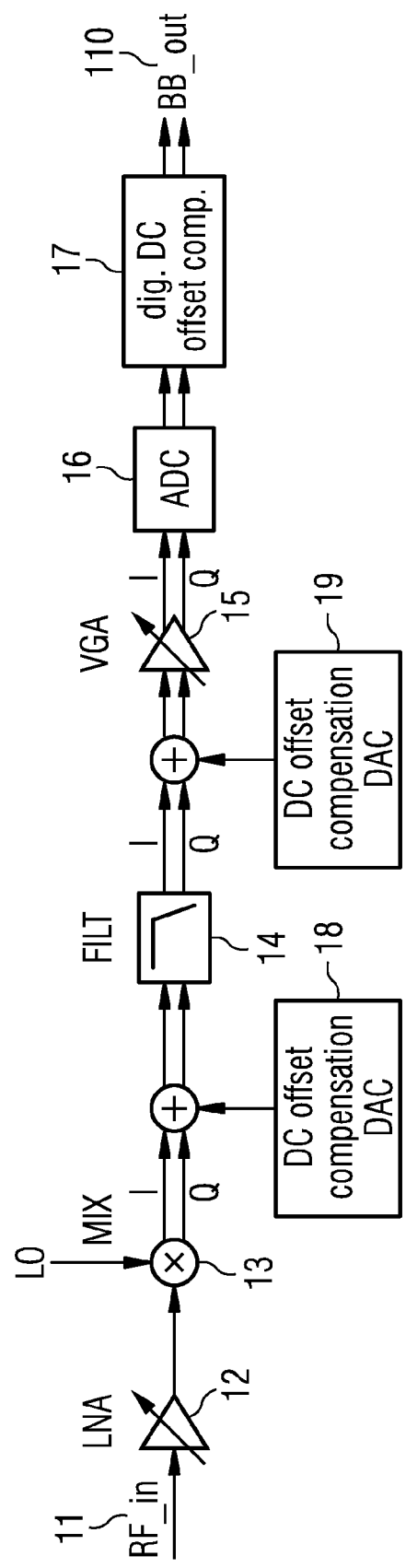
FIG. 1 shows a state-of-the-art direct conversion receiver architecture.
Figure 2:
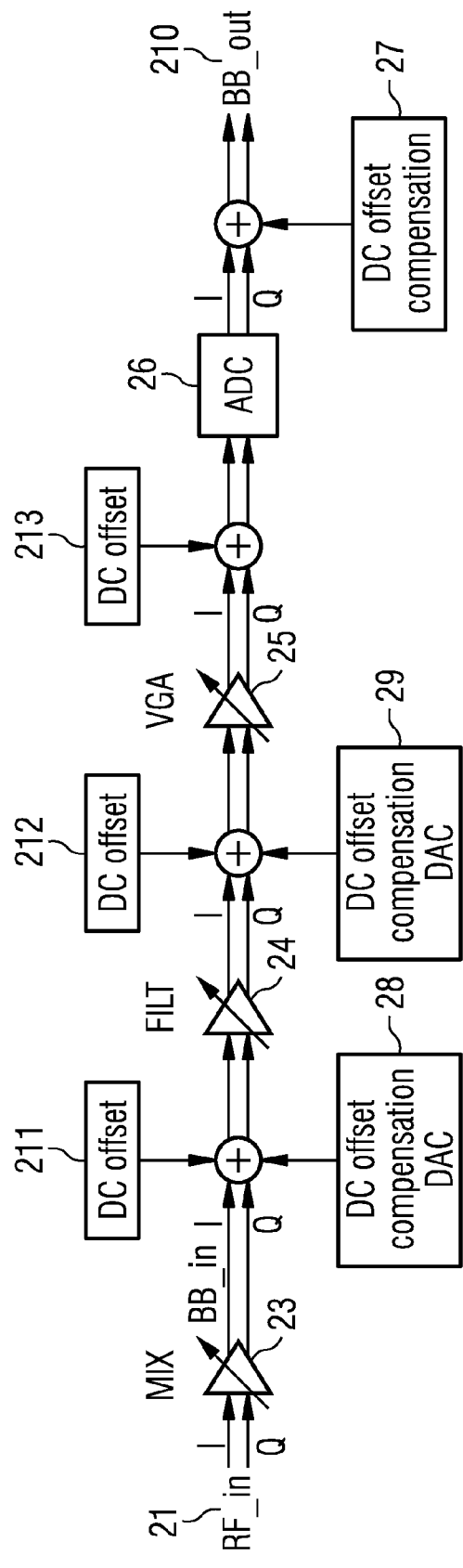
FIG. 2 shows a simplified receiver model.
Figure 3:
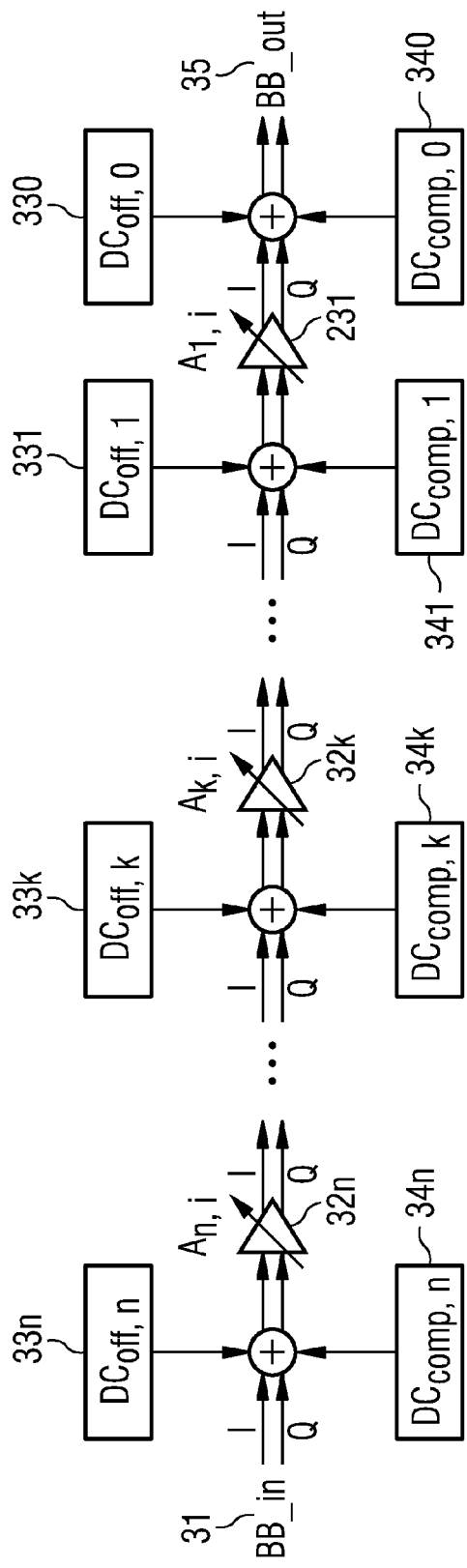
FIG. 3 shows mathematical receiver model.

At least one implementation provides a method to compensate DC offset in radio frequency transceiver architectures having an improved efficiency. At least one implementation provides an improved DC offset calibration method for RF transceivers with variable gain that provide multiple points with compensation DACs (digital to analog converters) for DC offset compensation.

At least one implementation relates to a method for compensating DC offset in a signal path comprising a plurality of stages, each stage k having an individual gain $A_k$ and a total gain $A_{tot,k}$ that is the product of the gains of all preceding stages and the gain of the stage: $A_{tot,k}=A_k*A_{tot,k-1}$.

For each stage a fine DC calibration is performed by introducing a raw DC compensation signal $DC_{comp,k}$ into the signal path of a stage of the plurality of stages by way of an compensation analog to digital converter that is electrically coupled to the stage.

The procedure is based on finding intersection points were the intersection points found represent the best compensation values. At least two lines, e.g. four points are required for obtaining one DC compensation signal. One line represents a set of different compensation DAC values for the dedicated gain of the stage behind the compensation DAC. Measurement values for at least two gain configurations are mandatory. More gains are possible. More measurement points for one gain configuration may help to increase the accuracy and eliminate nonlinearities of the compensation DACs.

A fine DC compensation signal is determined by setting the total gain of the stage stage to a value that equals the product of a first total gain of a preceding stage(s) and a first gain of the stage, setting at least two different DC compensation signals for the stage and measuring a DC residual signal at the output of the signal path for each of the two different DC compensation signals in order to determine a first linear relationship between DC compensation signal and DC offset residual at the output of the signal path, setting the total gain of the stage to a value that equals the product of a second total gain of the preceding stage(s) and a second gain of the stage, setting at least two different DC compensation signals and measuring a DC residual signal at the output of the signal path for each of the two different DC compensation signals in order to determine a second linear relationship between DC compensation value and the gain, for example the total gain, and determining an interception point of the first linear relationship and the second linear relationship, wherein the DC compensation signal of the interception point is the fine DC compensation signal.

The fine DC compensation may be performed stage by stage starting with the stage that is closest to the input of the signal path, i.e. closest to RF input, k=n.

The fine DC compensation may be performed stage by stage starting with the stage that is closest to the output of the signal path. Here, several iterations may be used.

One aspect of the fine DC calibration relates to the setting of the total gain of the preceding stages. The first and/or the second total gain of the preceding stages are preferably set to the mean total gain of the preceding stages. Therefore, the total gain of the preceding gain stages are constant and approximately in the middle of the used control range.

One aspect of the fine DC calibration relates to the setting of the gain of the stage. The first gain of the stage is preferably set to the minimum gain of the stage. The second gain of the stage is preferably set to the maximum gain of the stage.

The calibration coefficients obtained by the fine DC compensation keep the gain dependency of the DC offset residuum small.

One aspect relates to performing a raw DC calibration prior to the fine DC calibration. The raw DC calibration increases the stability of the calibration process so that the entire calibration procedure works for large and huge DC offsets. Raw DC calibration can be hardware supported and comprise any method referred to in the background section. Raw DC calibration methods have a broader error tolerance range compared to fine DC calibration methods. Usually raw DC calibration methods also converge faster.

For each stage a raw DC calibration may be performed by introducing a raw DC compensation signal $DC_{comp,k}$ into the signal path of the stage by means of an compensation digital to analog converter that is electrically coupled to the stage.

The raw DC compensation is performed stage by stage starting with the stage that is closest to the output of the signal path. The raw DC compensation signal for the stage is determined by performing the acts: (a) setting the total gain of the stage, (b) measuring a DC offset residual at the output of the signal path, (c) setting the raw DC compensation signal to a value that is the negative of the DC offset residual divided by the total gain of the stage.

One aspect of the raw DC calibration relates to augmenting the method by one calibration loop comprising the acts: (d) setting the total gain of the stage (e) measuring a DC offset residual at the output of the signal path, (f) setting the raw DC compensation signal to a value that is the difference between the previously set raw DC compensation signal and the DC offset residual divided by the total gain of the stage.

One aspect of the raw DC calibration relates to iteratively determining the raw DC compensation signals for m calibration iterations. The DC compensation parameter of gain stage k, $DC_{comp,k}$ can be calculated from the known total gain $A_{tot,k}$ and the measured DC offset residual $DC_{res}$ by the formula:

$$DC_{comp,k,m} = DC_{comp,k,m-1} - \frac{DC_{RES,m}}{A_{tot,k}}$$

where $DC_{comp,k,m}=0$.

One aspect of the raw DC calibration relates to the selection of the total gain $A_{tot,k}$ of each gain stage. It is preferably selected to be approximately in the middle between its minimum and maximum:

$$A_{tot,k} \approx \frac{A_{tot,k,max} - A_{tot,k,min}}{2}$$

The computed calibration coefficients obtained by the raw DC calibration are good enough to prevent the system from saturation while the fine DC calibration is performed.

Therefore, at least one implementation provides a method for determining a set of calibration parameters $DC_{comp,k}$ having the advantage of covering the complete gain control range from $A_{tot,n,min}$ to $A_{tot,n,max}$ so that changing the gain does not require any additional calibration tasks or calibration parameter changes.

At least one implementation may enable a transceiver to operate close to regular operation mode during calibration. Thus, unwanted measurement errors due to different device states, e.g. different bias and temperature conditions are avoided. Only loop back functionality might be needed. Power down or feed trough operation is not required.

Furthermore, at least one implementation may enable that only DC offset compensation elements, e.g. DACs that are common in present RF transceivers are required.

An implementation relates to compensating DC offset in a signal path. The signal path may have a plurality of stages, where for each stage a fine DC compensation is performed by introducing a fine DC compensation signal into the signal path of the stage by way of a compensation analog to digital converter. The fine DC compensation signal may be determined by setting the total gain of the stage to a value that equals the product of a first total gain of a preceding stage(s) and a first gain of the stage, setting at least two different DC compensation signals for the stage and measuring a DC residual signal at the output of the signal path for each of the two different DC compensation signals in order to determine a first linear relationship between DC compensation signal and DC offset residual at the output of the signal path, setting the total gain of the stage to a value that equals the product of a second total gain of the preceding stage(s) and a second gain of the stage, setting at least two different DC compensation signals and measuring a DC residual signal at the output of the signal path for each of the two different DC compensation signals in order to determine a second linear relationship between DC compensation value and gain, and determining an interception point of the first linear relationship and the second linear relationship. The DC compensation signal of the interception point is the fine DC compensation signal.

Figure 5:
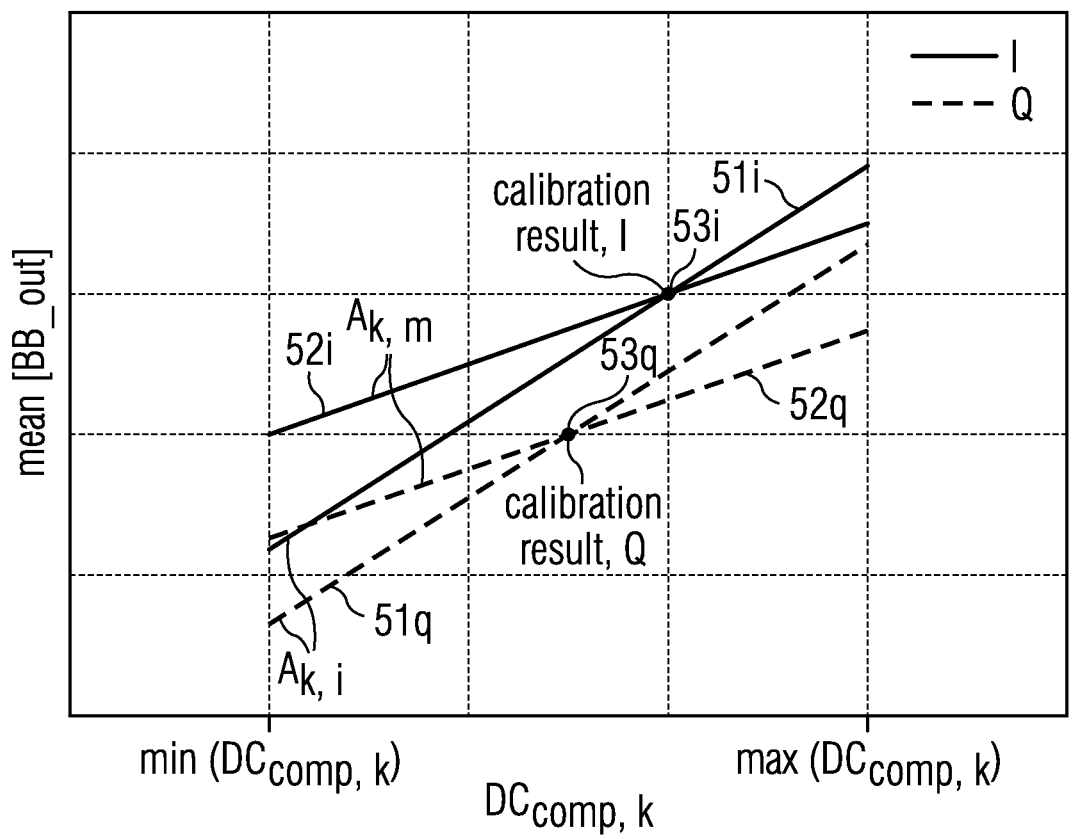
FIG. 5 shows diagram of functional relationships between DC offset compensation parameters and DC offset residuals.

FIG. 5 shows a diagram of a functional relationship of fine DC compensation signal and DC residual for one specific embodiment of the fine DC calibration procedure, wherein for each of the channels I and Q a calibration result is obtained by determining the first linear relationship for I 51*i* and Q 52*q* and the second linear relationship for I 52*i* and Q 52*q* and intersecting them in order to find the optimal DC compensation signal for I 53*i* and Q 53*q*.

Figure 6:
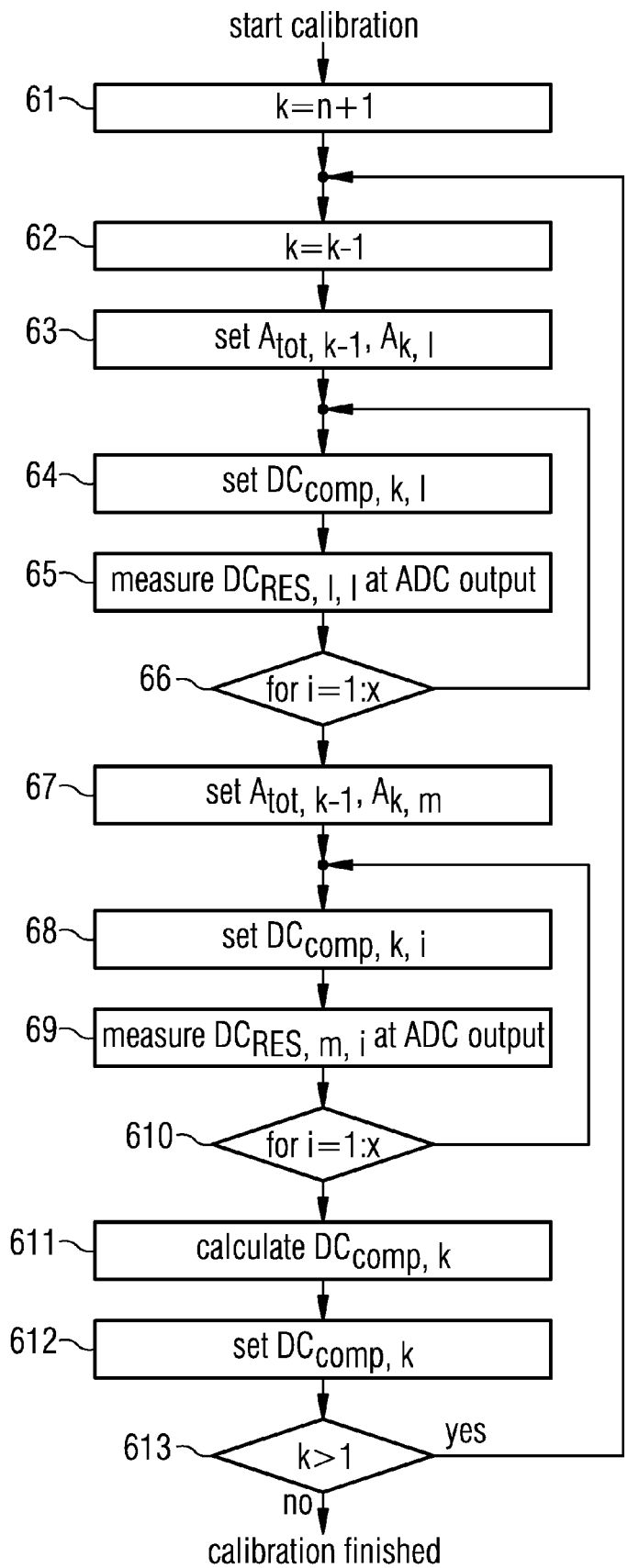
FIG. 6 shows a flow chart of method, procedure or algorithm for gain independent offset calibration.

FIG. 6 shows a flow chart of an embodiment of the fine DC calibration method, procedure or algorithm. At act 61 the stage index k is set to n+1, wherein n is the number of stages. The loop for a single stage comprises the acts 62 to 612, wherein the loop is exited at act 613 once all stages have been computed. It is also possible to modify the loop such that not all stages have acts 62 to 612 applied. In the following act 62 the stage index k is decremented by 1. Therefore, the following acts that relate to a single gain stage start with stage k=n, which is the stage closest to RF input. The total gain of the preceding stages $A_{tot,k-1}$ and the first gain $A_{k,I}$ of stage k is set in act 63. The first gain $A_{k,I}$ set to the minimum of gain $A_k$. In the first inner loop having loop index i and comprising the acts 64 and 65 the first linear relationship is determined for gain $A_{k,I}$. At least two points are needed, but up to x points may be computed, act 66. In act 64 the DC compensation signal $DC_{comp,k,I}$ is set. In act 65 the DC offset residual $DC_{RES,I,I}$ is measured at the output of the signal path. In the first inner loop the first DC compensation signal is set to its maximum and the second DC compensation signal is set to its minimum. Further DC compensation signals may be set somewhere in between. In act 67 the total gain of the preceding stages $A_{tot,k-1}$ and the second gain $A_{k,m}$ of stage k is set. The second gain $A_{k,m}$ is set to its maximum value. In the second inner loop having loop index i and comprising the acts 68 and 69 the second linear relationship is determined for gain $A_{k,m}$. At least two points are needed, but up to x points may be computed, act 66. In act 64 the DC compensation signal $DC_{comp,k,i}$ is set. In act 65 the DC offset residual $DC_{RES,I,i}$ is measured at the output of the signal path. In the first inner loop the first DC compensation signal is set to its maximum and the second DC compensation signal is set to its minimum. Further DC compensation signals may be set somewhere in between. In act 611 the DC compensation signal $DC_{comp,k}$ for stage k is computed. In act 612 the DC compensation signal $DC_{comp,k}$ is set.

Figure 4:
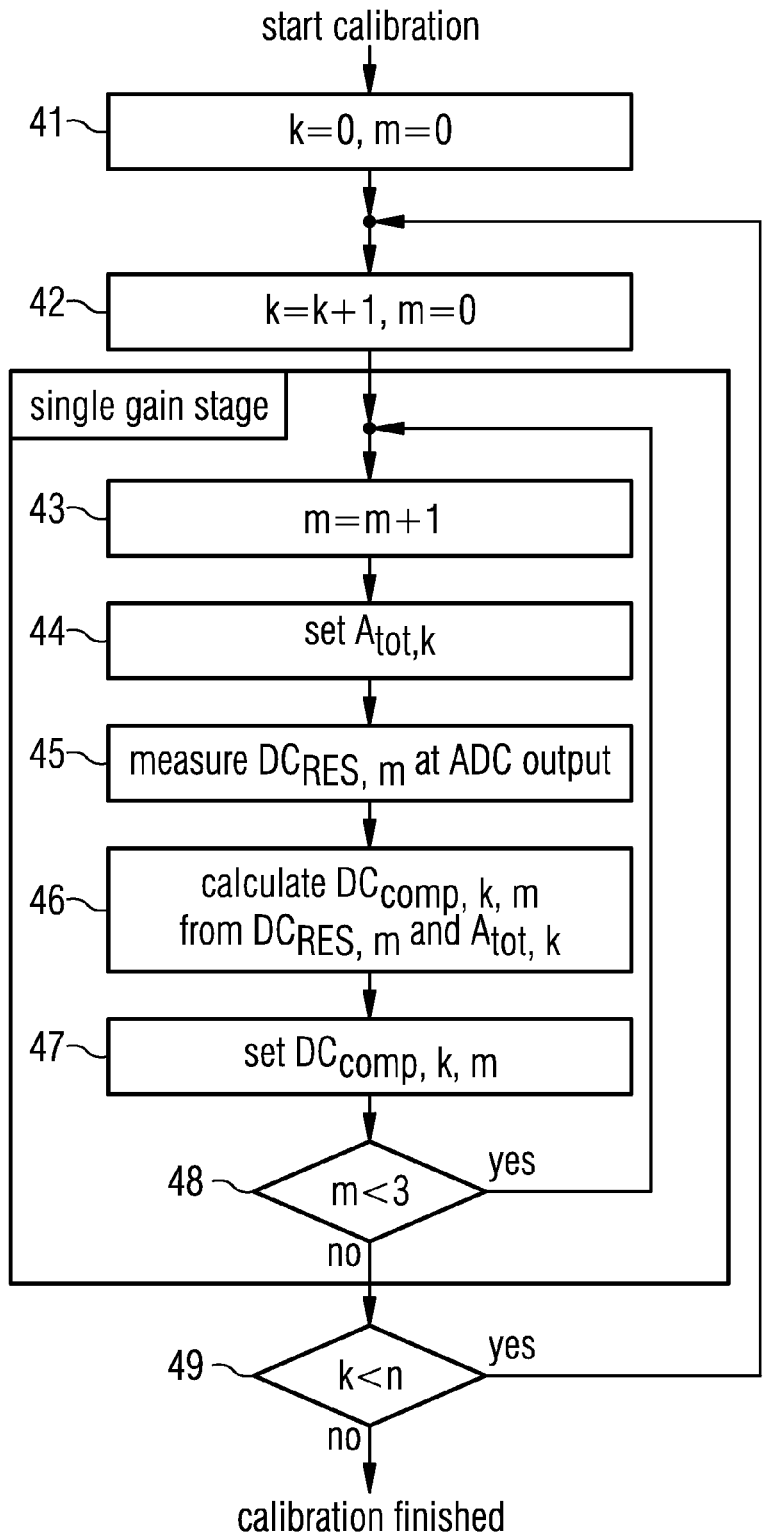
FIG. 4 shows flowchart of a raw DC offset calibration method, procedure or algorithm.

FIG. 4 shows a flow chart of an embodiment of a raw DC compensation algorithm that is executed before, for example, fine DC compensation is performed. In act 41 the algorithm is initialized by setting the stage index and the calibration iteration index to zero. The outer loop comprising acts 42 to 49 refers to the computation of raw DC offset compensation signals for all stages. In act 42 the stage index k is incremented by one. In act 49 the outer loop is exited once all stages have been computed. It is also possible to exit the outer loop before all stages have been computed. The inner loop comprising acts 43 to 48 refers to the computation of raw DC compensation signals for a single stage k. In act 43 the calibration index m is incremented by one. In act 44 the gain of stage k is set. In act 45 the resulting DC offset residual $DC_{RES,m}$ is measured. In act 46 the DC compensation signal $DC_{comp,k,m}$ is computed. In act 47 the DC compensation signal $DC_{comp,k,m}$ is set. The inner loop is executed three times according to act 48.

The methods, procedures, and algorithms discussed herein may be implemented in hardware circuitry, such as integrated circuitry. In addition, the methods, procedures, and algorithms may be implemented as instructions stored in one or more storage devices. The instructions may be executed by a processor to cause the methods, procedures, and algorithms to perform DC offset compensation. Furthermore, the methods, procedures, and algorithms may be incorporated in one or more transceiver devices.

While implementations have been illustrated and described in detail in the drawings and foregoing description, such illustration and description are to be considered illustrative or exemplary and not restrictive. It will be understood that changes and modifications may be made by those of ordinary skill within the scope and spirit of the following claims.

What is claimed is:

1. A method to provide a fine DC compensation, comprising:

setting a total gain of a stage associated with a signal path having a plurality of stages, the total gain set to a value that equals a product of a first total gain of at least one preceding stage and a first gain of the stage;

setting at least two different DC compensation signals for the stage;

measuring a DC residual signal at an output of the signal path for each of the two different DC compensation signals to determine a first linear relationship between the DC compensation signal and the DC offset residual at the output of the signal path;

setting the total gain of the stage to a value that equals a product of a second total gain of at least one preceding stage and a second gain of the stage;

setting the at least two different DC compensation signals;

measuring the DC residual signal at the output of the signal path for each of the two different DC compensation signals to determine a second linear relationship between the DC compensation value and total gain; and determining an interception point of the first linear relationship and the second linear relationship, a value represented at the interception point being the fine DC compensation signal.

2. The method according to claim 1, wherein the fine DC compensation is performed stage by stage starting with a stage that is closest to an input of the signal path.

3. The method according to claim 1, wherein the fine DC compensation is performed stage by stage starting with a stage that is closest to the output of the signal path.

4. The method according to claim 1, wherein the first total gain of the at least one preceding stage is a mean total gain of the at least one preceding stage.

5. The method according to claim 1, wherein the second total gain of the at least one preceding stage is a mean total gain of the at least one preceding stage.

6. The method according to claim 1, wherein the first gain of the stage is a minimum gain of the stage.

7. The method according to claim 1, wherein the second gain of the stage is a maximum gain of the stage.

8. The method according to claim 1, wherein one of the at least two different DC compensation signals is a minimum DC compensation signal or one of the at least two different DC compensation signals is a maximum DC compensation signal.

9. The method according to claim 1, wherein prior to the fine DC compensation a raw DC compensation is performed.

10. The method according to claim 9, wherein for each stage of the plurality of stages raw DC compensation is performed by introducing a raw DC compensation signal into the signal path of the stage by way of a compensation digital to analog converter coupled to the stage;

wherein the raw DC compensation is performed stage by stage starting with the stage that is closest to the output of the signal path;

wherein the raw DC compensation signal for the stage is determined by performing:

setting the total gain of the stage;

measuring a DC offset residual at the output of the signal path;

setting the raw DC compensation signal to a value that is a negative of the DC offset residual divided by the total gain of the stage.

11. The method according to claim 10, wherein the raw DC compensation signal for the stage is determined by further performing:

setting the total gain of the stage;

measuring the DC offset residual at the output of the signal path;

setting the raw DC compensation signal to a value that is a difference between a previously set raw DC compensation signal and the DC offset residual divided by the total gain of the stage.

12. The method according to claim 11, wherein the raw DC compensation signal for the stage is determined by further performing repeating the setting, measuring and setting acts of claim 10.

13. The method according to claim 10, wherein the total gain of the stage is set to a value that is an arithmetic mean of a maximum total gain of the stage and a minimum total gain of the stage.

* * * * *